United States Patent [19]

Ohm et al.

[11] Patent Number: 4,821,266
[45] Date of Patent: Apr. 11, 1989

[54] TESTABLE ELECTRONIC DEVICE AND METHOD OF TESTING SUCH A DEVICE

[75] Inventors: Heinz-Friedrich Ohm, Weiterstadt; Wolfgang Reisch, Frankfurt am Main, both of Fed. Rep. of Germany

[73] Assignee: VDO Adolf Schindling AG, Frankfurt am Main, Fed. Rep. of Germany

[21] Appl. No.: 12,445

[22] Filed: Feb. 9, 1987

[30] Foreign Application Priority Data

Feb. 20, 1986 [DE] Fed. Rep. of Germany ....... 3605431

[51] Int. Cl.⁴ ............................................. G06F 11/00
[52] U.S. Cl. ......................................... 371/16; 371/25
[58] Field of Search ....................... 371/15, 62, 16, 25; 364/424, 437.11

[56] References Cited

U.S. PATENT DOCUMENTS

| | | | |
|---|---|---|---|
| 4,339,801 | 7/1982 | Hosaka | 371/16 |
| 4,454,588 | 6/1984 | O'Brien | 371/16 |
| 4,497,057 | 7/1985 | Kato | 371/16 |
| 4,541,050 | 9/1985 | Honda | 371/16 |
| 4,604,746 | 8/1986 | Blum | 371/25 |
| 4,701,867 | 10/1987 | Bruggemann | 371/25 |
| 4,710,704 | 12/1987 | Ando | 371/25 |
| 4,710,932 | 12/1987 | Hiroshi | 371/25 |

Primary Examiner—Michael R. Fleming
Attorney, Agent, or Firm—Martin A. Farber

[57] ABSTRACT

In a method for the testing of an electronic device, particularly for automotive vehicles, having a microcomputer (2), an interface as well as device inputs and outputs (connector 6), the following separate test steps are provided: In one test step at least one predetermined combination of input signals is fed into the device inputs (connector 6), and the test output signals which occur in this connection at the inputs of hardware units (4, 8, 9) of the device (1) are picked up via the interface and compared externally with the combination of the input signals. In further test steps, test control signals are fed into a single hardware unit, and the test output signals produced thereby at the output of said hardware unit are picked up via the interface for an external normal/actual comparison. In a further test step, output test control signals are fed into at least one hardware unit (2, 3) which is connected with the device outputs and the output signals produced thereby at the device outputs (connector 6) are fed to an external normal/actual comparison.

7 Claims, 2 Drawing Sheets

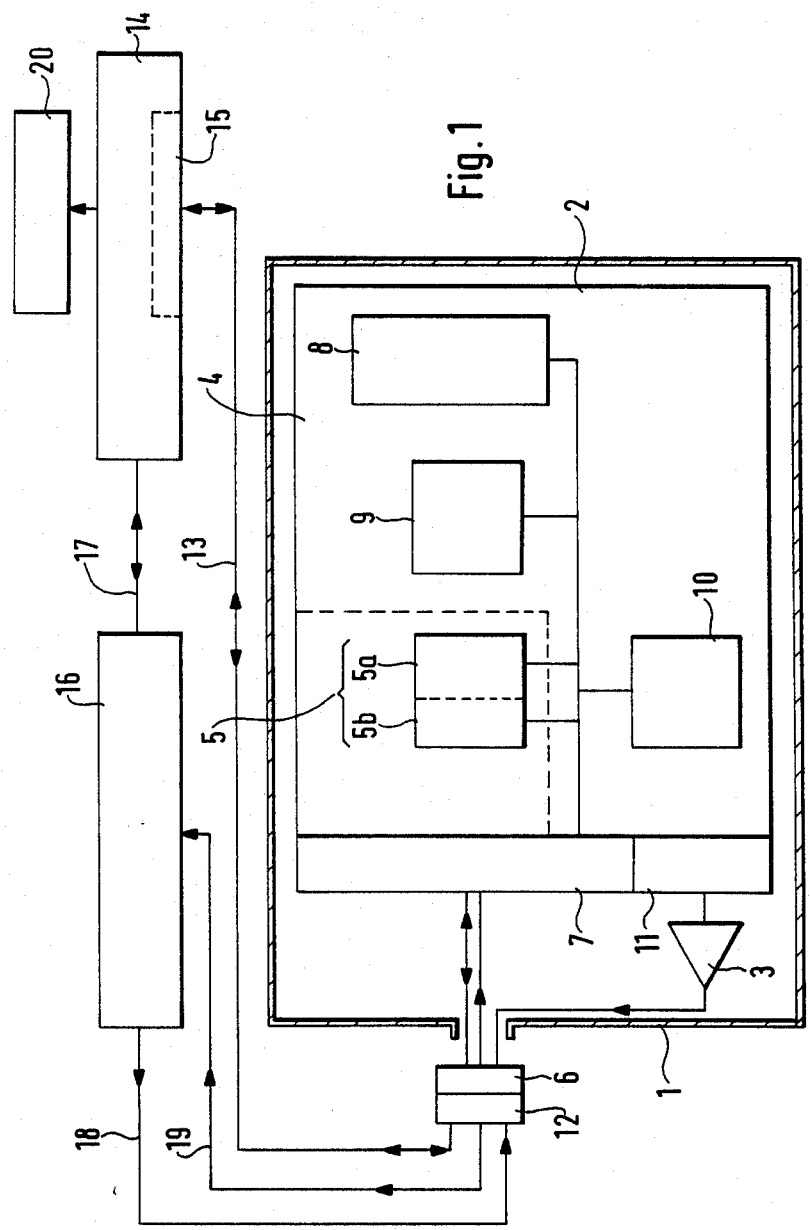

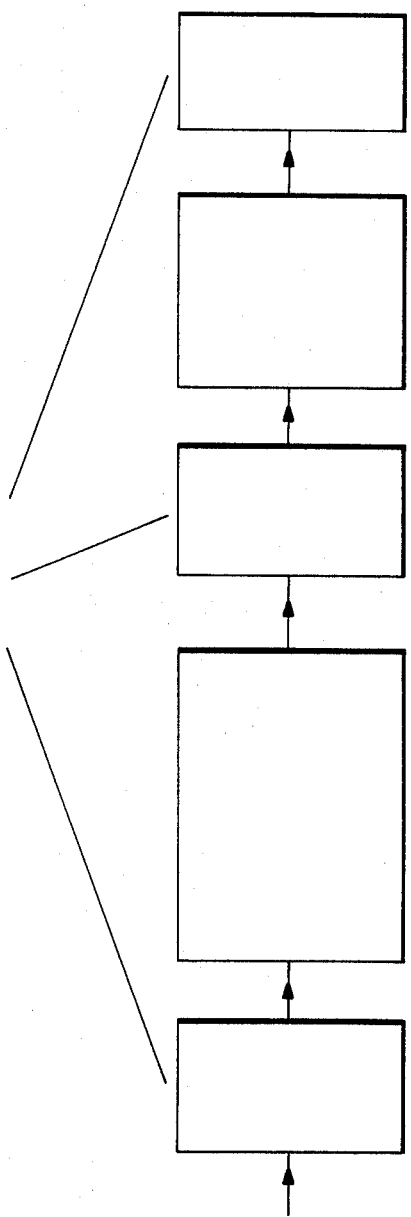

TESTABLE ELECTRONIC DEVICE AND METHOD OF TESTING SUCH A DEVICE

The present invention relates to a testable electronic device, particularly for automotive vehicles, having a microcomputer and an interface for connection to other devices providing input signals to the testable device, as well as receiving signals outputted by the testable device. Another aspect of the invention concerns a method of testing such a device, by a sequence of signal-feeding steps.

Electronic devices, particularly for automotive vehicles, are becoming more and more complicated, resulting, in the case of traditional testing devices and test methods, in longer test times and thus higher production costs. Such electronic devices for automotive vehicles can, for instance, be speed governors or control devices for transmitting the position of the gas pedal to the throttle valve. These devices, to which the invention in particular refers, contain a microcomputer as well as an interface for connection to other devices, for example to the gas-pedal position transmitter which supplies the input signals, and a setting element for the throttle valve which is acted on upon the output signals. The corresponding inputs and outputs of the device are frequently formed by contacts of a connector.

Up to now, such electronic devices have been tested in the manner that predetermined input signals are fed into the inputs and the output signals are evaluated. Therefore the testing extended to the device as a whole, including programs stored therein. This method of testing, it is true, did not as a rule require any particular development of the electronic device for the testing, but it was time-consuming because, after the feeding of input signals, it was sometimes necessary to wait long periods of time for test results. The long periods of time might be caused by normal functions of the device, for instance due to the time response of regulators which might have delay times of a few minutes. Similarly one must wait during build-up processes. The testing of the devices as a whole also was disadvantageous in that output signals might be difficult to interpret, and that the exact locating of the error required lengthy additional work.

SUMMARY OF THE INVENTION

The object of the present invention is therefore to provide a testable electronic device, particularly for automotive vehicles, of the aforementioned type which can be tested rapidly, with exact location of the error.

This object is achieved by developing the testable electronic device with individual hardware units (processor, memory, computer) which can be separately driven for testing via the interface, output signals of the testable device being accessible for comparison.

With this development of the testable device, the essential prerequisite is created for the fact that the device need not longer be tested coherently as a total system, but that the testing for the individual hardware units of the device can be carried out in each case separately. In particular, the separate testing takes place along the signal path from the input to the output of the device. In principle, however, the sequence of the testing of the individual hardware units is independent of each other. These electronic devices are well suited for testing with automated test methods. The fact that the testing need not be delayed by waiting for device-induced time response is advantageous since the corresponding time elements can in practice be circumvented by the separate controllability of the individual hardware units. The testing of the individual hardware units at the same time results in an exact locating of the error since the error which occurs upon a testing process must be limited to the hardware unit which is being tested at the time. The errors associated with a test step can be easily stored and documented. By the separate driving of the individual hardware units and the evaluation of the test output signals produced upon the driving of these hardware units, the testing of software stored in the device as to its functioning in use is intentionally substantially done away with. In this way also the testing process is accelerated and the search for errors simplified. The testing of this so-called main program of the device can therefore be substantially dispensed with, since software which was the same for all devices was sufficiently tested during the development and trial phases. The individual units of the electronic device to be tested are therefore referred to here as hardware units.

The testability of this electronic device is not necessarily limited to the phase directly following production but can also be repeated later on, possibly in the event of an error which occurs during its normal use.

Since the entire system of the electronic device for the testing is subdivided into individual hardware units, special control signals which give rise to the expectation of test output signals can be fed to these hardware units. In this way, by testing the individual hardware units in a sequence of test steps, a practically complete testing of the entire device is possible, but hardware units which are less susceptible to breakdown can, in addition, be excluded from the testing.

The evaluation of the test output signals which are produced upon the testing of each hardware unit, and are obtained at the interface of the device, is effected in a main test device by a normal/actual comparison. The main test device is connected via a line with a functional interface of the device to be tested for controlling the test processes which take place in succession in the individual hardware units. The line can represent a series connection over which the testable electronic device communicates with the main test device. For this purpose the main test device has a suitable functional interface. As used in this application, the expression "interface of the device" however, means not only a functional, controllable interface which can be formed of semiconductors, but in particular also the connector of the device over the contacts of which the hardware units of the device can be separately driven and from which the test output signals can be tapped off.

Output signals produced at the device outputs upon the testing of given hardware units are preferably not used directly for the normal/actual comparison in the main test device, but are first converted in an interposed measurement adapter which also communicates with the main test device in order to make a simple comparison possible. The measurement adapter can furthermore be used to feed input signals, controlled by the main test device, for testing purposes to the testable electronic device, the signals being so fed into the device or the connector of the device in the same way as input signals which occur in operation.

The testable electronic device preferably has, a memory in which test control data of a test program are stored. By means of this test program, test control signals can be produced in a sequence in the device, which act one after the other on individual hardware units so as to supply test output signals which can be evaluated in the synchronized main test device. For this purpose, the test program is activated in the testable device via the interfaces of the device and the main test device or via special signal lines.

Since the test control data of the test program in the testable device need not place in operation all device functions of the device, only a relatively small memory is required for their storage. The test control data can therefore be stored permanently in a memory area, for instance of a ROM.

However, if the entire memory space available in a device is required for the main program which determines the device functions in operation, it is also possible before the use in operation of the device, to store the test control data instead of the main program if an erasable memory, for instance an EROM is provided. This is another advantage of the specific hardware testing. In particular, it is sufficient to test a unit of the device which effects processing of data only with respect to its hardware function, for instance an arithmetic unit only by an arithmetic example which does not presuppose any sequence of commands, or a ROM memory for the storing of the correct data. Aside from these units of a microprocessor, a program memory can also be tested as hardware unit, in the manner that it is acted on by test control signals which permit a check-sum test in the main test device or a program transfer to the main test device in the manner that a normal/actual comparison takes place.

The essence of the testing method for the device of the invention may be summarized as follows, with a first test step a part of the device is tested from its inputs on an existing connector, into which the input signals are fed, up to points in the device which are connected with the connector and at which the input signals are to appear and from which the corresponding test output signals are to be picked up via the interface for the testing. The testing of further hardware units in the device itself takes place, as will be described in connection with a second test step. The test control signals, which can be produced in the device by the test control data stored in a storage area, permit a hardware testing of the individual hardware units. For the testing of the connection of the hardware units to the device outputs at the contacts of the device connector a last test step is provided. So that output signals appear at these device outputs, output test control signals are fed in a hardware unit connected in front of the device outputs, which output test control signals that represent a special case of the test control signals and can be produced in fundamentally the same manner as the latter.

BRIEF DESCRIPTION OF THE DRAWINGS

The invention will be described below with reference to the two figures of the drawings:

FIG. 1 shows an embodiment of a testable electronic device in a simplified showing, in combination with a main test device as well as a measurement adapter, and FIG. 2 shows the signal path of the device to be tested in a greatly simplified showing.

DETAILED DESCRIPTION OF THE PREFERRED EMBODIMENT

In FIG. 1, 1 is a testable electronic device 1 which comprises a microcomputer 2 and, connected to its output, an amplifier 3. The microcomputer 2 consists essentially of a processor 4 and a program memory 5, which is developed as EROM. The program memory 5 is divided into a memory area 5a for a main program and a memory area 5b for a test program.

The device 1 furthermore has a connector 6 with connector contacts (not shown) which serve as inputs of the device, and with connector contacts (also not shown) which serve as outputs at the amplifier 3. The connector is connected via a functional interface 7 components of the processor 4, namely, with its arithmetic unit 8, RAM memory 9 and its clock 10; furthermore, the interface 7 is connected with both areas of the program memory 5. Furthermore an output contact of the connector 6 is connected to the output of the amplifier 3, whose input is fed by the processors 4 via a converter 11.

The connector 6 fits in a mating connector 12 from which at least one line 13 of a serial connection leads to a main test device 14. The latter also has an interfaced 15 which corresponds with the interface 7. The main test device 14 is developed for the carrying out of a normal/actual comparison and for the activating of the test program in the device 1. The main test device 14 is connected with a measurement adaption 16 via a line 17 so that the measurement adaptor 16, when a corresponding control signal is given off by the main test device 14, produces an input signal on an input-signal line 18 which is connected via the mating connector 12 with the connector 6. From the mating connector 12 an output-signal line 19 leads to the measurement adaptor which produces, from the output signals, signals or data which can be taken as basis for the normal/actual comparison in the main test device 14. The result of the normal/actual comparison is documented by a printer 20.

For the successive testing of individual hardware units of the testable device 1 including the connector 6, a test program in the program memory 5 is activated by the main test device via the line 13. Furthermore the main test device gives a signal via the measurement adaption line 17 to the measurement adaptor 16, which is a first test step gives off a combination of input signals via the input signal line 18 to the connector 6. Via the interface 7 which is controlled by the main test device 14 and the test program in the program memory 5, the input signals appearing at the processor 4 are reported back as test output signals to the main test device 14 and taken as basis there for the normal/actual comparison.

Thereupon, in further test steps which are established by the test program, test control signals are produced by which the program memory and the processor are tested one after another with respect to hardware. For this purpose, the test output signals of these hardware units are conducted over the interface into the main test device 14 and used as basis for the normal/actual comparison. Also, the testing of the clock 10 in the processor 2 takes place in the manner that a time measurement between clock pulses is carried out and the time measurement is evaluated by comparison in the main test device.

In another test step, the processor 4 is so driven by the main test device 14 that output signals are given off to the connector 6 by the amplifier 3. The output signals pass over the output-signal line 19 in order to be converted into signals which can be used as basis for a normal/actual comparison in the main test device.

FIG. 2 diagrammatically indicates how, in succession from left to right, first of all a verification of the input signals is carried out, then a verification of the information connection and finally a control of the output signals. The functional separation of the testing of the hardware units from the software (main program), which no longer requires any substantial testing in the device, is essential.

We claim:

1. An electronic device, in particular for throttle valve control in automotive vehicles, the electronic device having a microcomputer with a memory and an interface for connection to external test equipment, the electronic device being at testable device having a self-testing function provided by reference signals stored in the memory, the self-testing function being activated in response to signals applied by the test equipment via the interface to the testable device, wherein the test equipment applies input signals to the testable device and receives output signals from the testable device; said testable device comprising:

individual hardware units including a processor and said memory of the microcomputer, said individual hardware units being separately operable for testing via the interface; and wherein said reference signals are normal output signals produced by respective ones of said hardware units; and output signals produced by the hardware units are externally accessible via the interface for a comparison of actual output signals of the testable device with normal output signals of the testable device.

2. An electronic device according to claim 1, wherein said memory is a program memory of the microcomputer and stores test control data of a test program.

3. An electronic device according to claim 2, wherein said program memory includes a memory area in which the test control data are permanently stored.

4. An electronic device according to claim 2, wherein said program memory includes an erasable memory area in which the test control data are stored before an operational use of the testable device.

5. An electronic device according to claim 1, wherein said interface comprises a connector of the device.

6. A method of testing an electronic device, particularly for automotive vehicles, the electronic device having a microcomputer, an interface, an input port and output port, and wherein the microcomputer comprises hardware units including a microprocessor, a program memory, a random access memory (RAM) and an arithmetic unit (AU); the method comprising storing test control data in said program memory facilitate a testing of the device by external test equipment;

feeding by means of external test equipment a set of input signals into the intput port of the device, there being output test signals occurring at terminals of the hardware units in response to the input signals;

receiving the output test signals via the interface;

comparing the output test signals with the set of the input signals externally to said device to verify transmission of input signals;

feeding test control signals into individual ones of said hardware units;

receiving resulting test output signals produced at terminals of said hardware units via the interface; and comparing output test signals with the test control signals for an external normal/actual comparison to verify an information connection among the hardware units;

feeding output test control signals into a hardware unit which is connected with an output port of the testable device; and comparing resulting output signals of the testable device for normal and actual values, the comparing being done externally to the testable device to verify operation of an individual hardware unit.

7. A method according to claim 6, wherein one or more of the following test output signals are employed in said comprising steps for the testing of the program memory as hardware unit:

check-sum signals; and signals with which the entire main program is outputted for the normal/actual comparison; and for the testing of the microprocessor:

RAM signals from a RAM memory;

clock signals from a clock; and signals from the arithmetic unit.

* * * * *